United States Patent
Nakamura et al.

(10) Patent No.: US 7,854,821 B2
(45) Date of Patent: Dec. 21, 2010

(54) SUBSTRATE PROCESSING APPARATUS

(75) Inventors: Hiroshi Nakamura, Nirasaki (JP); Seiichi Kaise, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 970 days.

(21) Appl. No.: 11/445,385

(22) Filed: Jun. 2, 2006

(65) Prior Publication Data

US 2007/0009649 A1    Jan. 11, 2007

Related U.S. Application Data

(60) Provisional application No. 60/690,887, filed on Jun. 16, 2005.

(30) Foreign Application Priority Data

Jun. 2, 2005    (JP) ............................ 2005-163263

(51) Int. Cl.
    H01L 21/00    (2006.01)
(52) U.S. Cl. .................. 156/345.53; 118/724; 361/234; 279/128
(58) Field of Classification Search ............ 156/345.53; 361/234; 279/128; 118/724
    See application file for complete search history.

(56) References Cited

U.S. PATENT DOCUMENTS 5,567,267 A * 10/1996 Kazama et al. ........ 156/345.27
5,673,750 A * 10/1997 Tsubone et al. ............. 165/275
6,532,796 B1 * 3/2003 Ikeda ............................ 73/37

FOREIGN PATENT DOCUMENTS

| JP | 2000-232098 | 8/2000 |
| JP | 2002-252271 | 9/2002 |

OTHER PUBLICATIONS

Japanese Office Action with English translation dated Jul. 13, 2010 in Japanese Patent Application No. 2005-163263, 6 pages.

* cited by examiner

Primary Examiner—Ram N. Kackar
(74) Attorney, Agent, or Firm—Oblon, Spivak, McClelland, Maier & Neustadt, L.L.P.

(57) ABSTRACT

A substrate processing apparatus includes a heat transfer gas supply mechanism to supply a heat transfer gas through a supply passage into a portion between a worktable and a substrate to improve thermal conductivity between therebetween. Under the control of a control section, the pressure inside the supply passage is measured to obtain a pressure measurement value while the substrate is placed on the worktable. Then, a preparatory flow rate of the heat transfer gas to be supplied through the supply passage into the portion between the worktable and substrate is determined, in accordance with the pressure difference between the pressure measurement value and a pressure reference value, prior to a main process to be performed on the substrate. Then, the heat transfer gas is supplied through the supply passage into the portion between the worktable and substrate at the preparatory flow rate, prior to the main process.

8 Claims, 12 Drawing Sheets

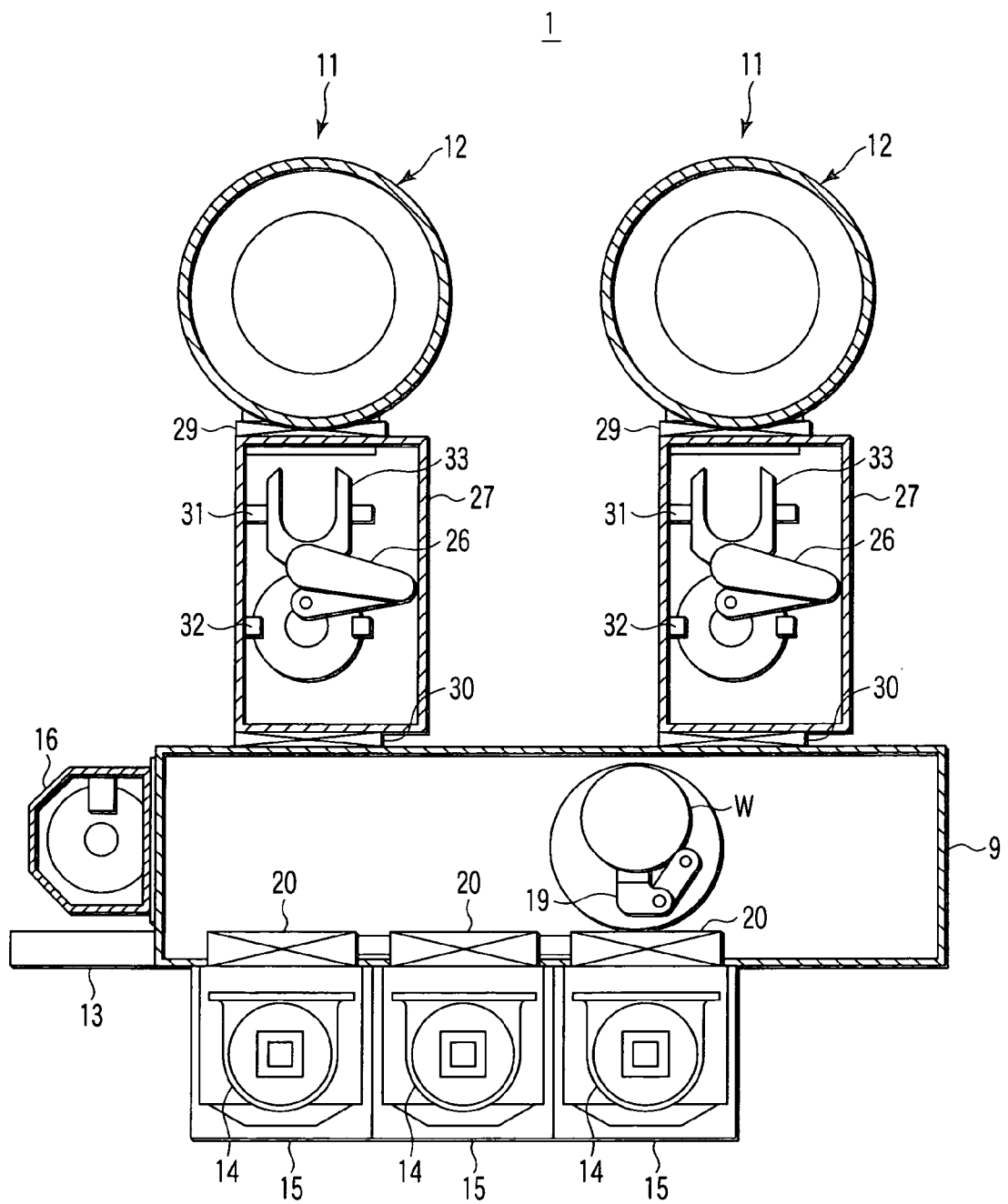
F I G. 1

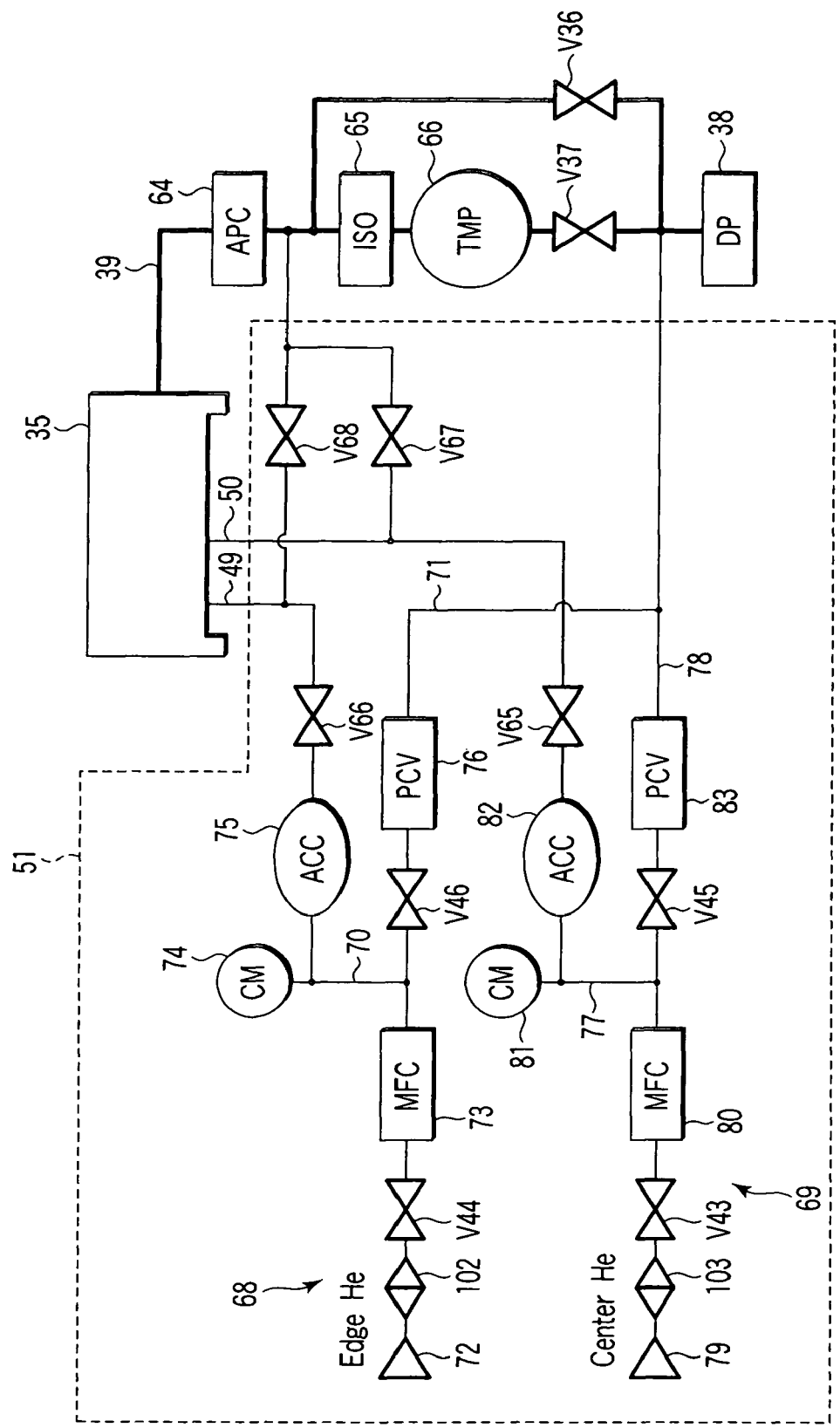
F I G. 3

| P/C | Recipe name | Time | Step number | Time | RF elapsed time |
|---|---|---|---|---|---|
| 1 | | 00:00.0 | 0 | 00:00.0 | 2:22 |
| 2 | | 00:00.0 | 0 | 00:00.0 | 0:02 |
| 3 | | 00:00.0 | | 00:00.0 | 0:00 |

| Item (with filter) | | P/C1 | | P/C2 | | P/C3 | |
|---|---|---|---|---|---|---|---|
| | | Set value | Status value | Set value | Status value | Set value | Status value |
| Pressure | Pa | 1.33E-2 | 1.33E-2 | 1.33E-2 | 1.33E-2 | 1.33E-2 | 1.33E-2 |
| Upper RF | W | — | — | — | — | — | — |
| Upper RF reflection wave | W | — | — | — | — | — | — |
| Upper Vpp | V | — | — | — | — | — | — |
| Lower RF | W | 0 | 0 | 0 | 0 | 0 | 0 |
| Lower RF reflection wave | W | — | — | — | — | — | — |
| Lower Vpp | V | — | — | — | — | — | — |
| Lower Vdc | V | — | — | — | — | — | — |
| N2 | SCCM | 0 | 0 | 0 | 0 | 0 | 0 |
| N2 | SCCM | 0 | 0 | 0 | 0 | 0 | 0 |
| N2 | SCCM | 0 | 0 | 0 | 0 | 0 | 0 |
| N2 | SCCM | 0 | 0 | 0 | 0 | 0 | 0 |
| N2 | SCCM | 0 | 0 | 0 | 0 | 0 | 0 |

End    No filter

FIG. 8

| Recipe preset flow rate sccm | Pressure difference Torr | Acceleration flow rate sccm | Acceleration time sec |
|---|---|---|---|
| 0.1-5.4 | 0.1-1.0 | 7.0 | 1.5 |
| | 1.1-2.0 | 20.0 | 2.5 |
| | 2.1-3.0 | 20.0 | 1.4 |
| | 3.1-4.0 | 20.0 | 2.0 |
| | 4.1-5.0 | 20.0 | 2.5 |
| | 5.1-7.5 | 20.0 | 3.8 |
| | 7.6-10.0 | 20.0 | 4.5 |
| | 10.0-100.0 | 0.0 | 0.0 |
| 5.5-10.4 | 0.1-3.0 | 0.0 | 0.0 |
| | 3.1-4.0 | 20.0 | 2.0 |
| | 4.1-5.0 | 20.0 | 2.5 |
| | 5.1-7.5 | 20.0 | 3.8 |
| | 7.6-10.0 | 20.0 | 6.0 |
| | 10.1-15.0 | 50.0 | 2.4 |
| | 15.1-20.0 | 50.0 | 3.2 |
| | 20.1-25.0 | 50.0 | 4.0 |
| | 25.1-30.0 | 50.0 | 4.8 |
| | 30.1-35.0 | 50.0 | 5.6 |
| | 35.1-40.0 | 50.0 | 6.4 |
| | 40.1-45.0 | 50.0 | 7.2 |
| | 45.1-100.0 | 0.0 | 0.0 |
| 10.5-999.9 | 0.1-100.0 | 0.0 | 0.0 |

SUBSTRATE PROCESSING APPARATUS

CROSS-REFERENCE TO RELATED APPLICATIONS

This application claims the benefit of U.S. Provisional Application No. 60/690,887, filed Jun. 16, 2005.

This application is based upon and claims the benefit of priority from the prior Japanese Patent Application No. 2005-163263, filed Jun. 2, 2005, the entire contents of which are incorporated herein by reference.

BACKGROUND OF THE INVENTION

1. Field of the Invention

The present invention relates to a substrate processing apparatus, a method for using the same, and a computer readable medium containing program instructions for execution on a processor, and particularly to a vacuum processing technique utilized in semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

An apparatus for processing a substrate, such as a semiconductor wafer, by plasma, such as a plasma etching apparatus, includes a vacuum process chamber and a susceptor (worktable) disposed therein for placing the substrate thereon. Since the substrate is heated due to plasma during processing, a temperature adjusting mechanism is built in the susceptor for cooling the substrate. The thermal conductivity between the susceptor and substrate depends on the substance present between them. When the interior of the process chamber is set in a vacuum state, the portion between the susceptor and substrate also becomes vacuum, and thus the thermal conductivity between them is extremely decreased (the thermal connection is cut off). Accordingly, in order to ensure the thermal conductivity, the susceptor is provided with a heat transfer gas supply mechanism configured to supply a heat transfer gas, such as helium (He) gas between the susceptor and substrate (for example, Jpn. Pat. Appln. KOKAI Publication No. 2002-252271 (Patent Document 1)).

The heat transfer gas is supplied at a predetermined flow rate and pressure from a gas supply section disposed below the susceptor. The heat transfer gas line (heat transfer gas supply passage) is provided with an MFC (Mass Flow Controller) and a PCV (Pressure Control Valve) configured to control the supply flow rate and pressure of the heat transfer gas. The MFC and PCV adjust the flow rate and pressure of the heat transfer gas in accordance with preset values prescribed in a plasma process menu (which will be referred to as a recipe).

When the substrate is removed from the susceptor, the heat transfer gas supply mechanism stops supply of the heat transfer gas, and thus the pressure inside the heat transfer gasoline is decreased. Accordingly, when a new substrate is placed on the susceptor and subjected to a plasma process, the pressure inside the heat transfer gas line needs to be increased to a predetermined pressure prescribed in a recipe.

In recent years, in order to improve the throughput, it is required to shorten the time period necessary for each of the steps of a plasma process. As regards the pressure increase of the heat transfer gas line, a so-called acceleration sequence is applied after a substrate is placed on the susceptor and before a plasma process (main process) is performed. Hereinafter, the acceleration sequence means an operation of supplying the heat transfer gas into the line thereof at a flow rate higher than the predetermined flow rate prescribed in the recipe. This operation shortens the time period necessary for increasing the pressure inside the line of the heat transfer gas supply mechanism.

BRIEF SUMMARY OF THE INVENTION

An object of the present invention is to provide a substrate processing apparatus, which can improve the controllability of a heat transfer gas supply mechanism; a method for using the same, and a computer readable medium containing program instructions for execution on a processor.

According to a first aspect of the present invention, there is provided a substrate processing apparatus comprising:

a process chamber configured to accommodate a substrate;

a worktable disposed in the process chamber to place the substrate thereon;

a temperature adjusting mechanism configured to adjust a temperature of the worktable;

a heat transfer gas supply mechanism configured to supply a heat transfer gas through a supply passage into a portion between the worktable and the substrate to improve thermal conductivity between the worktable and the substrate; and a control section configured to control an operation of the processing apparatus, wherein the control section executes measuring a pressure inside the supply passage to obtain a pressure measurement value in a state where the substrate is placed on the worktable, determining a preparatory flow rate of the heat transfer gas to be supplied through the supply passage into the portion between the worktable and the substrate, in accordance with a pressure difference between the pressure measurement value and a pressure reference value, prior to a main process to be performed on the substrate, and supplying the heat transfer gas through the supply passage into the portion between the worktable and the substrate at the preparatory flow rate, prior to the main process.

According to a second aspect of the present invention, there is provided a method of using a substrate processing apparatus, which comprises a process chamber configured to accommodate a substrate, a worktable disposed in the process chamber to place the substrate thereon, a temperature adjusting mechanism configured to adjust a temperature of the worktable, and a heat transfer gas supply mechanism configured to supply a heat transfer gas through a supply passage into a portion between the worktable and the substrate to improve thermal conductivity between the worktable and the substrate, the method comprising:

measuring a pressure inside the supply passage to obtain a pressure measurement value in a state where the substrate is placed on the worktable, determining a preparatory flow rate of the heat transfer gas to be supplied through the supply passage into the portion between the worktable and the substrate, in accordance with a pressure difference between the pressure measurement value and a pressure reference value, prior to a main process to be performed on the substrate, and supplying the heat transfer gas through the supply passage into the portion between the worktable and the substrate at the preparatory flow rate, prior to the main process.

According to a third aspect of the present invention, there is provided a computer readable medium containing program instructions for execution on a processor used for a substrate processing apparatus, which comprises a process chamber configured to accommodate a substrate, a worktable disposed in the process chamber to place the substrate thereon, a temperature adjusting mechanism configured to adjust a temperature of the worktable, and a heat transfer gas supply mechanism configured to supply a heat transfer gas through a supply passage into a portion between the worktable and the substrate to improve thermal conductivity between the worktable and the substrate, wherein the program instructions, when executed by the processor, cause the apparatus to execute:

measuring a pressure inside the supply passage to obtain a pressure measurement value in a state where the substrate is placed on the worktable, determining a preparatory flow rate of the heat transfer gas to be supplied through the supply passage into the portion between the worktable and the substrate, in accordance with a pressure difference between the pressure measurement value and a pressure reference value, prior to a main process to be performed on the substrate, and supplying the heat transfer gas through the supply passage into the portion between the worktable and the substrate at the preparatory flow rate, prior to the main process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a plan view schematically showing the structure of a semiconductor processing system according to an embodiment of the present invention;

FIG. 3 is a piping diagram schematically showing the structure of a heat transfer gas supply mechanism used in the apparatus shown in FIG. 2;

FIG. 8 is a view showing a monitoring page on the display of an operational controller used in the system shown in FIG. 1;

FIG. 12 is a view showing a table for the acceleration sequence of a heat transfer gas executed before an RIE process.

DETAILED DESCRIPTION OF THE INVENTION

Figure 2:
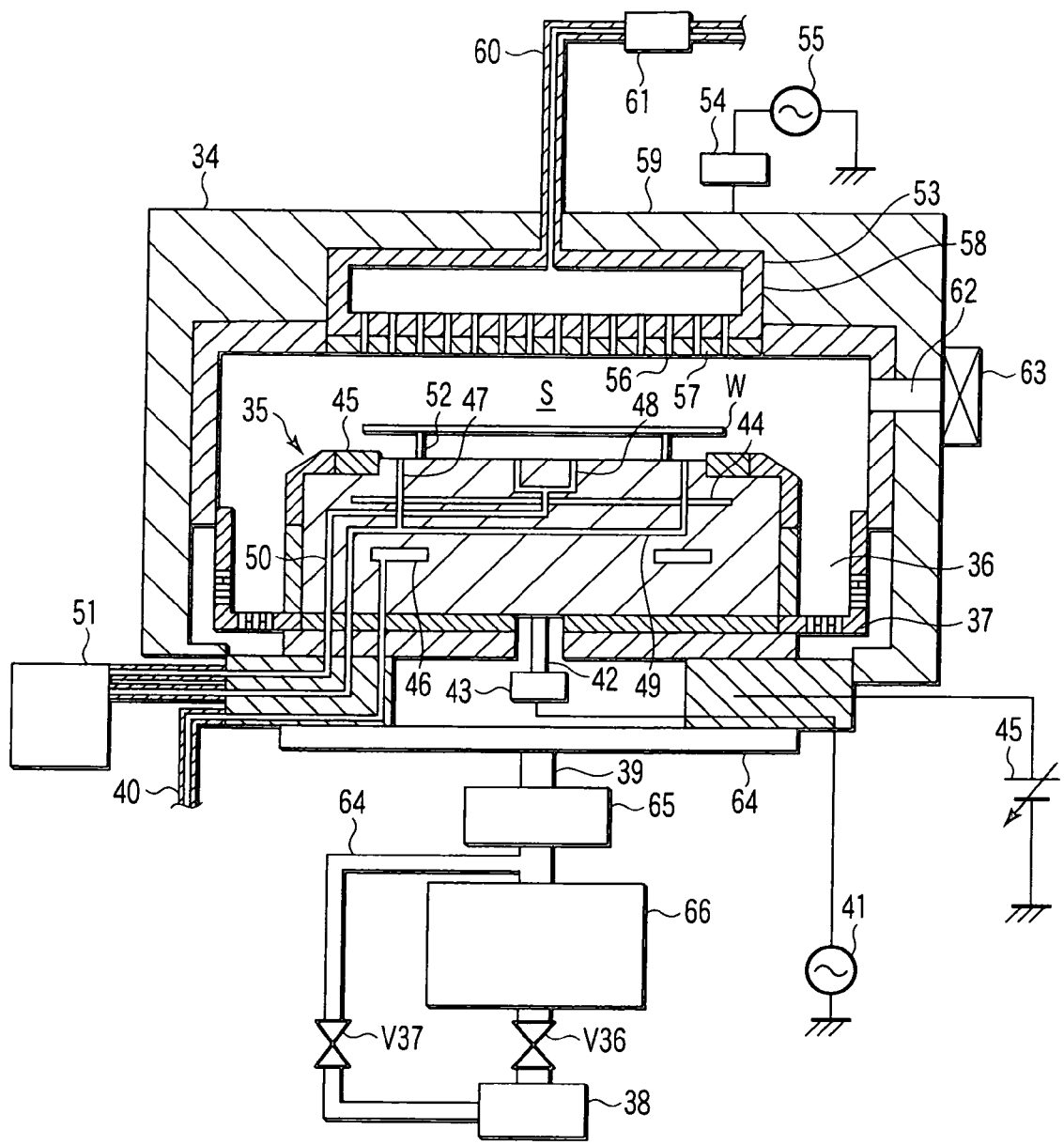
FIG. 2 is a sectional view schematically showing the structure of a plasma processing apparatus used in the system shown in FIG. 1.

In the process of developing the present invention, the inventors studied problems caused in the prior art in relation to the acceleration sequence of a heat transfer gas executed before the main process. As a result, the inventors have arrived at the findings given below.

Specifically, according to the conventional acceleration sequence, an increased flow rate of a heat transfer gas is set in accordance with the absolute value of a predetermined pressure of the heat transfer gas prescribed in a recipe, on the premise that the pressure inside a heat transfer gas line is zero. In other words, in this acceleration sequence, an increased flow rate of a heat transfer gas is set to raise the pressure in the line from zero to a predetermined pressure.

However, in general, the heat transfer gas line contains a residue of the heat transfer gas or the like supplied in a preceding plasma process. Thus, the pressure in the line is not necessarily zero when the acceleration sequence is started. Accordingly, an increased flow rate of the heat transfer gas set on the premise that the pressure in the line is zero may exceed the necessary flow rate for attaining a predetermined pressure of the heat transfer gas prescribed in a recipe. In this case, the controllability of the heat transfer gas supply mechanism is deteriorated, such that the pressure in the line overshoots the predetermined pressure. Further, a deteriorated controllability of the heat transfer gas supply mechanism brings about a delay in attaining the predetermined pressure, thereby lowering the throughput.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIG. 1 is a plan view schematically showing the structure of a semiconductor processing system according to an embodiment of the present invention. As shown in FIG. 1, the semiconductor processing system 1 includes a plurality of process ships 11 each for performing an RIE (Reactive Ion Etching) process on a semiconductor wafer W. The process ships 11 are connected to a long side of a rectangular loader transfer chamber 9 used as a common transfer chamber.

Three FOUP tables 15 are connected to the other long side of the loader transfer chamber 9 opposite the process ships 11 and face the process ships 11. A FOUP (Front Opening Unified Pod) used as a container for storing, e.g., 25 wafers W is placed on each of the FOUP tables 15. An orientor 16 for performing pre-alignment of the position of a wafer W transferred from the FOUPs 14 is connected to one end of the loader transfer chamber 9 in the longitudinal direction.

The loader transfer chamber 9 has three load ports 20 used as transfer passages of wafers W, which are formed in the sidewall at positions corresponding to the respective FOUP tables 15. The loader transfer chamber 9 is provided with a transfer arm mechanism 19 disposed therein for transferring a wafer W. The transfer arm mechanism 19 takes a wafer W from each of the FOUPs 14 on the FOUP tables 15 through the load ports 20. The transfer arm mechanism 19 then transfers the wafer W thus taken out, among the process ships 11 and orientor 16.

Each of the process ships 11 includes a vacuum processing apparatus or plasma processing apparatus 12 for performing an RIE process on a wafer W. The plasma processing apparatus 12 is connected to a load-lock chamber 27 provided with a transfer arm 26 disposed therein for transferring a wafer W.

The inner pressure of the loader transfer chamber 9 is set at atmospheric pressure, while the inner pressure of the plasma processing apparatus 12 of each process ship 11 is set at a vacuum. Accordingly, the load-lock chamber 27 is used as a vacuum preparation transfer chamber configured to adjust the inner pressure thereof. The load-lock chamber 27 is connected to the plasma processing apparatus 12 through a vacuum gate valve 29. The load-lock chamber 27 is further connected to the loader transfer chamber 9 through an atmospheric gate valve 30.

The transfer arm 26 is disposed essentially at the center of the load-lock chamber 27. A first buffer 31 is disposed at a position between the transfer arm 26 and plasma processing apparatus 12. A second buffer 32 is disposed at a position between the transfer arm 26 and loader transfer chamber 9. The first buffer 31 and second buffer 32 are disposed on the orbit of a support portion 33 connected to the distal end of the transfer arm 26 for supporting a wafer W. A wafer W subjected to the RIE process is temporarily shunted above the orbit of the support portion 33, so that the wafer W subjected to the RIE process can be smoothly exchanged for a wafer W to be subjected to the RIE process relative to the plasma processing apparatus 12.

The semiconductor processing system 1 includes a system controller (not shown) for controlling the operations of the process ships 11, loader transfer chamber 9, orientor 16, and so forth (which will also be referred to as components). The semiconductor processing system 1 further includes an operational controller 13 disposed at one end of the loader transfer chamber 9 in the longitudinal direction. The system controller is configured to control the operations of the components in accordance with the program of an RIE process. The operational controller 13 includes a display, such as an LCD (Liquid Crystal Display), which is used for displaying the operational situations of the components.

This embodiment is exemplified by one semiconductor processing system 1 including two process ships 11. Alternatively, for example, two semiconductor processing systems each including two process ships may be connected to each other, so that one wafer W can be subjected to four different plasma processes by four process ships.

FIG. 2 is a sectional view schematically showing the structure of the plasma processing apparatus 12 used in the system 1 shown in FIG. 1. As shown in FIG. 2, the plasma processing apparatus 12 includes a cylindrical process chamber 34 made of aluminum, the inner wall of which is covered with an alumite coating. The process chamber 34 is provided with a columnar susceptor 35 disposed therein and used as a worktable for placing thereon a wafer W having a diameter of, e.g., 300 mm.

In the plasma processing apparatus 12, an exhaust passage 36 is defined between the inner wall of the process chamber 34 and the sidewall of the susceptor 35, and is used as a passage for exhausting gas above the susceptor 35 out of the process chamber 34. An annular baffle plate 37 is disposed in the exhaust passage 36 to prevent plasma from leaking. The space of the exhaust passage 36 downstream from the baffle plate 37 extends below the susceptor 35, and communicates with a variable butterfly valve or automatic pressure control valve (which will be referred to as an APC valve) 64.

The APC valve 64 is connected to a turbo molecular pump (which will be referred to as a TMP) 66 used as a vacuum-exhaust pump, through a main exhaust line having an isolator 65. The TMP 66 is connected to a dry pump (which will be referred to as a DP) 38 used as an exhaust pump, through a valve V36. The APC valve 64, isolator 65, TMP 66, main exhaust line 39, valve V36, DP 38, and so forth constitute an exhaust system. The APC valve 64 is used to control the pressure inside the process chamber 34, and the TMP 66 and DP 38 are used to decrease the pressure inside the process chamber 34 to an essentially vacuum state.

A bypass line 67 connects a portion between the isolator 65 and TMP 66 to the DP 38 through a valve V37. The bypass line 67 and valve V37 are used to bypass the TMP 66, so as to roughly exhaust the interior of the process chamber 34 by the DP 38.

The susceptor 35 is connected to a radio frequency (RF) power supply 41 for a lower electrode through a feed rod 42 and a matcher 43. The RF power supply 41 is used to supply a predetermined RF power to the susceptor 35, so that the susceptor 35 functions as the lower electrode. The matcher 43 is configured to decrease reflection of the RF power from the susceptor 35, thereby maximizing the supply efficiency to the susceptor 35.

The susceptor 35 is provided with a circular conductive film built therein as an ESC (Electro-Static Chuck) electrode plate 44. The ESC electrode plate 44 is electrically connected to a direct current (DC) power supply 45. The DC power supply 45 applies a DC voltage to the ESC electrode plate 44 to generate a Coulomb force or Johnsen-Rahbek force, by which the wafer W is attracted and held on the upper surface of the susceptor 35.

An annular focus ring 46 is disposed on the susceptor 35 to surround the wafer W attracted and held on the upper surface of the susceptor 35. The focus ring 46 is exposed to a space S for generating plasma, and works to focus ions and radicals of the plasma toward the surface of the wafer W, so as to improve the efficiency of an RIE process.

The susceptor 35 is further provided with a cooling cell 46 (temperature adjusting unit) formed therein and extending in, e.g., an annular direction. A coolant, such as cooling water, set at a predetermined temperature is circulated in the cooling cell 46 from a chiller unit (not shown) through a coolant line 40. The process temperature of the wafer W attracted and held on the upper surface of the susceptor 35 is controlled by the temperature of the coolant.

The portion of the upper surface of the susceptor 35 where the wafer W is attracted and held (which will be referred to as a mount face) has a plurality of heat transfer gas supply holes formed therein. The heat transfer gas supply holes include a plurality of peripheral holes 47 disposed to face the peripheral portion of the wafer W, and a plurality of central holes 48 disposed to face the central portion of the wafer W.

The peripheral holes 47 and central holes 48 are connected to a heat transfer gas supply section 51 through two supply passages 49 and 50, respectively, formed in the susceptor 35. The gas supply section 51 is arranged to supply helium gas used as a heat transfer gas through the peripheral holes 47 and central holes 48 into the gap between the mount face and the bottom of the wafer W. The peripheral holes 47 and central holes 48, two supply passages 49 and 50, gas supply section 51, and so forth constitute a heat transfer gas supply mechanism.

The susceptor 35 is further provided with a plurality of lifter pins or pusher pins 52 disposed therein, which can project from the mount face of the susceptor 35. The pusher pins 52 is operated by a motor (not shown) to project and retreat relative to the mount face. The rotational motion given by the motor (not shown) is converted into a rectilinear motion by a ball screw (not shown). When the wafer W is attracted and held on the mount face to perform an RIE process on the wafer W, the pusher pins 52 is retreated in the susceptor 35. Where the wafer W is transferred to and from the susceptor 35, the pusher pins 52 is projected from the mount face of the susceptor 35.

A showerhead 53 is disposed at the ceiling of the process chamber 34 and faces the susceptor 35. The showerhead 53 is connected to an RF power supply 55 for an upper electrode through a matcher 54. The RF power supply 55 is used to supply a predetermined RF power to the showerhead 53, so that the showerhead 53 functions as the upper electrode. The matcher 54 has the same function as that of the matcher 43 described above.

The showerhead 53 includes an upper electrode plate 57 having a number of gas holes 56 disposed on the lower side, and an electrode support body 58 for detachably supporting the upper electrode plate 57. The electrode support body 58 is provided with a buffer cell 59 formed therein and connected to a process gas supply section (not shown) through a gas supply line 60. The gas supply line 60 is provided with a line insulator 61 disposed thereon. The line insulator 61 is formed of an insulative body to prevent an RF power supplied to the showerhead 53 from leaking through the gas supply line 60 into the process gas supply section. A process gas is supplied from the gas supply line 60 into the buffer cell 59 of the showerhead 53 and is then supplied into the process chamber 34 through the gas holes 56.

The process chamber 34 has a transfer port 62 for the wafer W formed in the sidewall, on which a gate valve 63 is attached. The transfer port 62 is located at a position corresponding to the height of the wafer W lifted from the susceptor 35 by the pusher pins 52.

As described above, according to the process chamber 34 of the plasma processing apparatus 12, RF powers are supplied to the susceptor 35 and showerhead 53 to generate an RF electric field in the space S between the susceptor 35 and showerhead 53. Consequently, a process gas supplied from the showerhead 53 is turned into high density plasma in the space S, by which the wafer W is subjected to an RIE process.

Specifically, when an RIE process is performed on the wafer W in the plasma processing apparatus 12, the gate valve 63 is first opened, and the wafer W to be processed is loaded into the process chamber 34. Then, a DC voltage is applied to the ESC electrode plate 44, so that the wafer W thus loaded is attracted and held on the mount face of the susceptor 35. Further, a process gas (such as a mixture gas of $CF_4$ gas, $O_2$ gas, and Ar gas) is supplied at a predetermined flow rate and a flow rate ratio from the showerhead 53 into the process chamber 34. At this time, the pressure inside the process chamber 34 is controlled to be a predetermined value by the APC valve 64 and so forth. Furthermore, an RF power is applied by the susceptor 35 and showerhead 53 to the space S within the process chamber 34. Consequently, the process gas supplied from the showerhead 53 is turned into plasma, thereby generating ions and radicals in the space S. The radicals and ions thus generated are focused by the focus ring 46 onto the surface of the wafer W to physically and chemically etch the surface of the wafer W.

FIG. 3 is a piping diagram schematically showing the structure of the heat transfer gas supply mechanism used in the apparatus 12 shown in FIG. 2. As shown in FIG. 3, the heat transfer gas supply section 51 includes a peripheral supply circuit 68 and a central supply circuit 69. The peripheral supply circuit 68 is arranged to supply helium gas through the supply passage 49 and peripheral holes 47 into the gap between the mount face and the bottom of the wafer W. The central supply circuit 69 is arranged to supply helium gas through the supply passage 50 and central holes 48 into the gap between the mount face and the bottom of the wafer W.

The peripheral supply circuit 68 includes a main line 70 and a sub line 71. One end of the main line 70 is connected to the supply passage 49. The other end of the main line 70 is connected to a helium gas supply source 72 for supplying helium gas to the main line 70. The main line 70 is provided with a filter 102, a valve V44, an MFC 73, a CM (Capacity Manometer) 74, an ACC (Accumulator) 75, and a valve V66 disposed thereon in this order from the helium gas supply source 72 to the supply passage 49.

In the main line 70, the filter 102 is arranged to remove dust or the like contained in helium gas supplied from the helium gas supply source 72. The valve V44 is arranged to control supply of helium gas from the helium gas supply source 72 to the main line 70. The MFC 73 is arranged to control the flow rate of helium gas flowing through the main line 70. The CM 74 is arranged to measure the pressure of helium gas flowing through the main line 70. The ACC 75 is arranged to temporarily store helium gas flowing through the main line 70. The valve V66 is arranged to control supply of helium gas from the main line 70 to the supply passage 49. The main line 70 is connected to a portion of the main exhaust line 39 between the APC valve 64 and isolator 65 through a valve V68.

One end of the sub line 71 is connected to a sub line 78 of the central supply circuit 69, as described later. The other end of the sub line 71 is connected to a portion of the main line 70 between the MFC 73 and CM 74. The sub line 71 is provided with a valve V46 and a PCV 76 disposed thereon in this order from the main line 70 to the sub line 78.

In the sub line 71, the valve V46 is arranged to control the flow of helium gas from the main line 70 to the sub line 78. The PCV 76 is arranged to control the pressure of helium gas flowing through the sub line 71. The sub line 71 is connected to a portion of the main exhaust line 39 between the valve V37 and DP 38 through the sub line 78.

The peripheral supply circuit 68 is used to supply helium gas to the peripheral portion of the gap between the mount face and the bottom of the wafer W. At this time, the valves V44, V46, and V66 are opened. The MFC 73 controls the flow rate of helium gas flowing through the main line 70. The PCV 76 controls the pressure of helium gas flowing through the sub line 71. Consequently, the PCV 76 controls the pressure of helium gas flowing through the main line 70, because the main line 70 communicates with the sub line 71 through the opened valve V46.

In the structure shown in FIG. 3, the peripheral supply circuit 68 includes the MFC 73 and PCV 76. However, the MFC 73 may be replaced with a PCV, and the PCV 76 may be replaced with an orifice. In this case, the orifice preferably has a diameter of, e.g., 0.2 mm.

The central supply circuit 69 includes a main line 77 and a sub line 78. One end of the main line 77 is connected to the supply passage 50. The other end of the main line 77 is connected to a helium gas supply source 79 for supplying helium gas to the main line 77. The main line 77 is provided with a filter 103, a valve V43, an MFC 80, a CM 81, an ACC 82 and a valve V65 disposed thereon in this order from the helium gas supply source 79 to the supply passage 50.

In the main line 77, the filter 103 is arranged to remove dust or the like contained in helium gas supplied from the helium gas supply source 79. The valve V43 is arranged to control supply of helium gas from the helium gas supply source 79 to the main line 77. The MFC 80 is arranged to control the flow rate of helium gas flowing through the main line 77. The CM 81 is arranged to measure the pressure of helium gas flowing through the main line 77. The ACC 82 is arranged to temporarily store helium gas flowing through the main line 77. The valve V65 is arranged to control supply of helium gas from the main line 77 to the supply passage 50. The main line 77 is connected to a portion of the main exhaust line 39 between the APC valve 64 and isolator 65 through a valve V67.

One end of the sub line 78 is connected to a portion of the main exhaust line 39 between the valve V37 and DP 38. The other end of the sub line 78 is connected to a portion of the main line 77 between the MFC 80 and CM 81. The sub line 78 is provided with a valve V45 and a PCV 83 disposed thereon in this order from the main line 77 to a portion of the main exhaust line 39 between the valve V37 and DP 38.

In the sub line 78, the valve V45 is arranged to control the flow of helium gas from the main line 77 to the sub line 78. The PCV 83 is arranged to control the pressure of helium gas flowing through the sub line 78.

The central supply circuit 69 is used to supply helium gas to the central portion of the gap between the mount face and the bottom of the wafer W. At this time, the valves V43, V45, and V65 are opened. The MFC 80 controls the flow rate of helium gas flowing through the main line 77. The PCV 83 controls the pressure of helium gas flowing through the sub line 78. Consequently, the PCV 83 controls the pressure of helium gas flowing through the main line 77, because the main line 77 communicates with the sub line 78 through the opened valve V45.

In the structure shown in FIG. 3, the central supply circuit 69 includes the MFC 80 and PCV 83. However, the MFC 80 may be replaced with a PCV, and the PCV 83 may be replaced with an orifice. In this case, the orifice preferably has a diameter of, e.g., 0.2 mm.

The valves V65, V66, V67, and valve V68 respectively comprise open/close sensors.

Figure 4A:
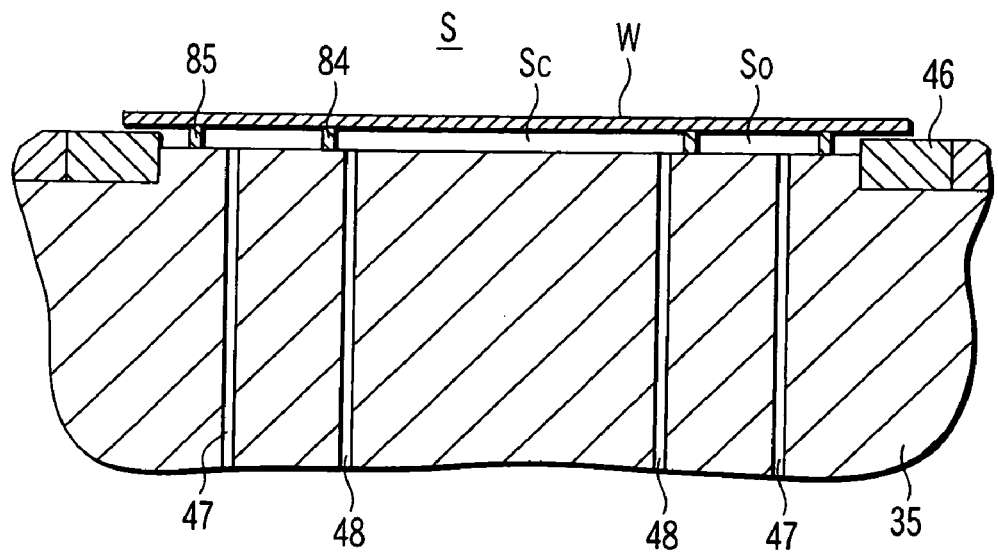
FIG. 4A is an enlarged sectional view schematically showing the structure of a susceptor near the mount face thereof, used in the apparatus shown in FIG. 2.

FIG. 4A is an enlarged sectional view schematically showing the structure of the susceptor 35 near the mount face thereof, used in the apparatus 12 shown in FIG. 2. As shown in FIG. 4A, the mount face is provided with two protrusions (inner protrusion 84 and outer protrusion 85), which are circular and annular with different diameters and concentrically disposed. The center of the inner protrusion 84 essentially agrees with the center of the wafer W. The center of the outer protrusion 85 also essentially agrees with the center of the wafer W.

These inner protrusion 84 and outer protrusion 85 directly support the wafer W. The wafer W is attracted and held on the susceptor 35 by the ESC electrode plate 44, so that the wafer W is brought into close contact with the top of the inner protrusion 84 and outer protrusion 85.

The central holes 48 are opened to a space Sc surrounded by the inner protrusion 84 and wafer W, to supply helium gas into the space Sc. The peripheral holes 47 are opened to a space So surrounded by the inner protrusion 84, outer protrusion 85, and wafer W, to supply helium gas into the space So. The helium gas thus supplied into the space So and space Sc can scarcely leak out of the respective spaces. The helium gas thereby efficiently transfers heat of the wafer W to the susceptor 35.

As shown in FIG. 4A, the outer diameter of the wafer W is larger than the outer diameter of the mount face, and the helium gas does not come into contact with the outer edge of the wafer W. Consequently, the temperature of the outer edge of the wafer W tends to increase more than the temperature of the central portion of the wafer W. In consideration of this fact, the heat transfer gas supply mechanism is arranged to set the supply pressure of helium gas to the peripheral holes 47 to be higher than the supply pressure of helium gas to the central holes 48, so that the heat transfer efficiency of the space So becomes higher than that of the space Sc. With this arrangement, the outer edge of the wafer W is cooled more efficiently than the central portion of the wafer W, thereby uniformizing the temperature of the wafer W.

Figure 4B:
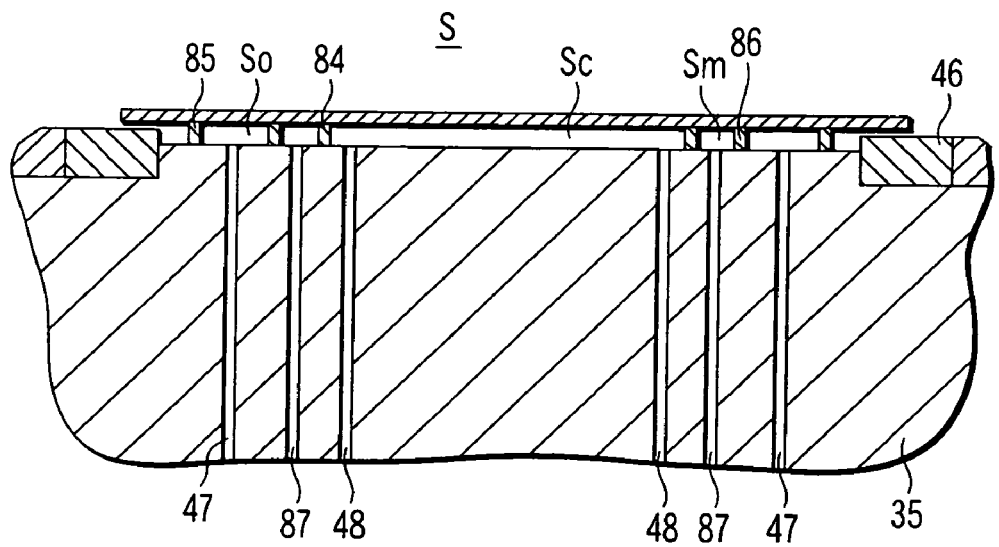
FIG. 4B is an enlarged sectional view schematically showing the structure of a susceptor near the mount face thereof according to a modification.

FIG. 4B is an enlarged sectional view schematically showing the structure of the susceptor 35 near the mount face thereof according to a modification. In addition to the inner protrusion 84, outer protrusion 85, peripheral holes 47, and central holes 48 described above, the modification of the heat transfer gas supply mechanism shown in FIG. 4B includes a middle protrusion 86 and middle holes 87. The middle protrusion 8 is disposed between the inner protrusion 84 and outer protrusion 85 concentrically with them. The middle holes 87 are opened to a space Sm surrounded by the middle protrusion 86, inner protrusion 84, and wafer W, to control the pressure inside the space Sm.

In the modification of the heat transfer gas supply mechanism shown in FIG. 4B, even if high pressure helium gas within the space So leaks through small interstices between the middle protrusion 86 and wafer W, the helium gas thus leaking is sucked into the middle holes 87 to control the pressure inside the space Sm. Consequently, the pressure inside the space Sc can be kept constant, thereby preventing the central portion of the wafer W from being cooled too much, to reliably uniformize the temperature of the wafer W.

In the structure shown in FIG. 4B, only one pressure controllable space Sm is disposed between the space So and space Sc. However, the number of spaces Sm is not limited to one, and two or more spaces Sm may be disposed between the space So and space Sc. This arrangement makes it possible to more reliably uniformize the temperature of the wafer W.

Figure 5:
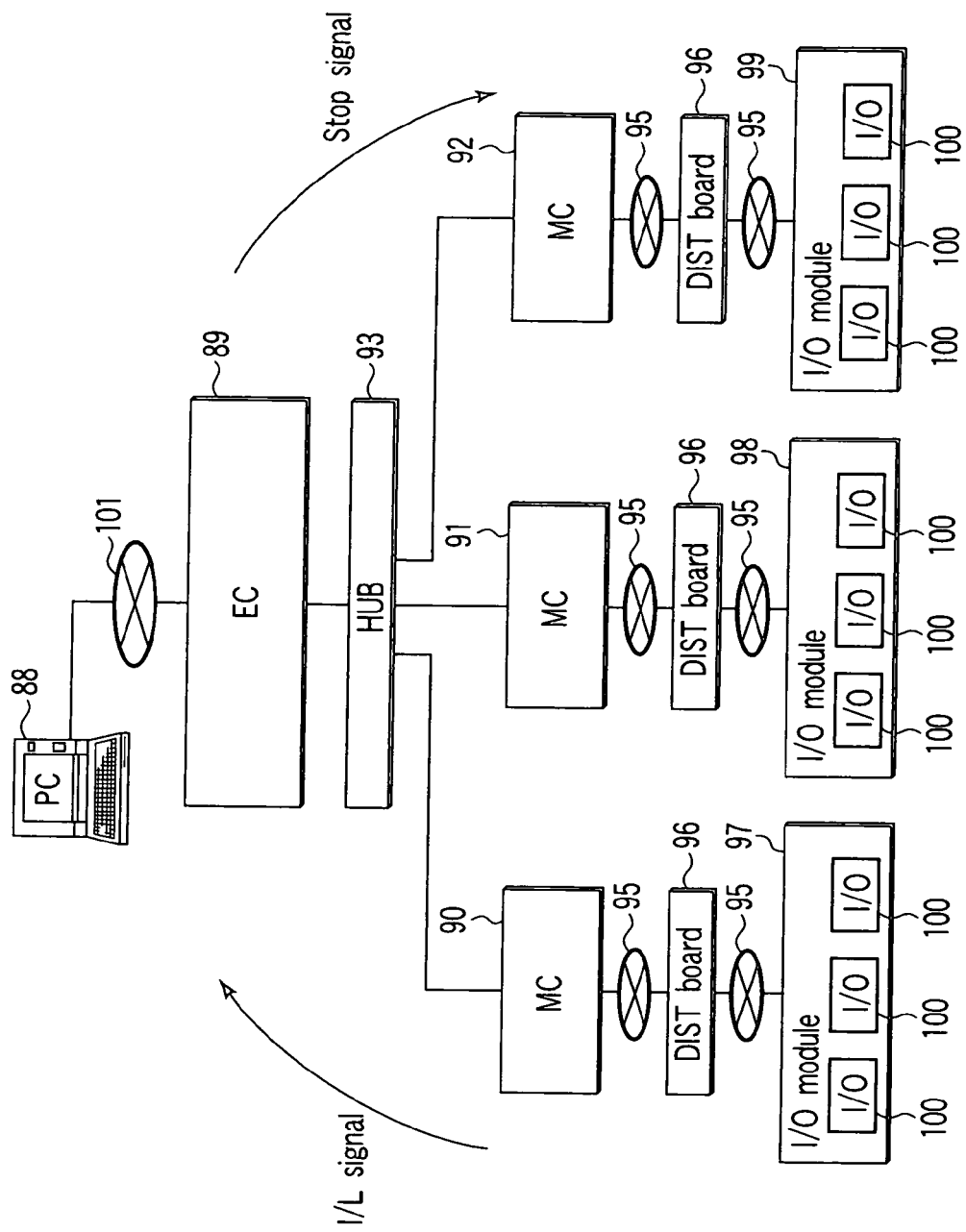
FIG. 5 is a view schematically showing the structure of a system controller used in the system shown in FIG. 1.

FIG. 5 is a view schematically showing the structure of a system controller used in the system 1 shown in FIG. 1. As shown in FIG. 5, the system controller comprises an EC (Equipment Controller) 89, a plurality of, e.g., three, MCs (Module Controller) 90, 91, and 92, and a switching hub 93 configured to connect the EC 89 to each of the MCs. The system controller is connected from the EC 89 through a LAN (Local Area Network) 101 to a PC 88 used as an MES (Manufacturing Execution System) that administrates the manufacturing steps of the entire factory including the semiconductor processing system 1. The MES works in cooperation with the system controller to feed real-time information of the steps, performed in the factory, back to a basic operation system (not shown), and to make judgment concerning the steps in consideration of the load and so forth of the entire factory.

The EC 89 includes a CPU, a RAM, a HDD, and so forth, and functions as an overall control section that governs the respective MCs to control the entire operation of the semiconductor processing system 1. In the operational controller 13, the CPU of the EC 89 transmits control signals to the respective MCs, in accordance with a program corresponding to the menu or recipe of a processing method for a wafer W designated by a user or the like. Consequently, the operational controller 13 controls the operation of the process ships 11 and loader transfer chamber 9.

The switching hub 93 switches the MCs to be connected to the EC 89 in accordance with control signals supplied from the EC 89. The MCs 90, 91, and 92 function as control sections to control the operation of the process ships 11 and loader transfer chamber 9. Each of the MCs also includes a CPU, a RAM, a HDD, and so forth, and transmits control signals to end devices described later. The system controller of the system 1 shown in FIG. 1 includes a plurality of MCs, the number of which corresponds to the number of the process ships 11 and loader transfer chamber 9, to respectively control them. Accordingly, FIG. 5 shows three MCs.

Each of the MCs is respectively connected to the corresponding one of I/O (input/output) modules 97, 98, and 99 through a GHOST network 95 by a DIST (Distribution) board 96. The GHOST network 95 is a network realized by an LSI called GHOST (General High-Speed Optimum Scalable Transceiver) mounted on the MC board of each MC. The GHOST network 95 can be connected to 31 I/O modules at the maximum. In the GHOST network 95, the MC is the master and the I/O module is a slave.

The I/O module 97 comprises a plurality of I/O portions 100 respectively connected to components (which will be referred to as end devices) of one of the process ships 11. The I/O module 97 transmits control signals to the end devices and output signals from the end devices. For example, the end devices connected to the I/O portions 100 of the I/O module 97 include components of the gas supply section 51 of the plasma processing apparatus 12, such as the valves V43, V44, V45, V46, V65, and V66, MFCs 73 and 80, CMs 74 and 81, ACCs 75 and 82, and PCVs 76 and 83.

The I/O modules 98 and 99 have the same structure as the I/O module 97. The connection manner of the MC 91 and I/O module 98 to the process ship 11, and the connection manner of the MC 92 and I/O module 99 to the loader transfer chamber 9 are the same as the connection manner of the MC 90 and I/O module 97 described above. Accordingly, their explanation will be omitted.

Each GHOST network 95 is also connected to an I/O board (not shown) configured to control input/output of digital signals, analog signals, and serial signals in the I/O portions 100.

In the semiconductor processing system 1, an acceleration sequence of the heat transfer gas is executed before an RIE process is performed as described later. At this time, the CPU of the EC 89 transmits control signals to predetermined end devices through the switching hub 93, MC 90, GHOST network 95, and I/O portions 100 of the I/O module 97, in accordance with the program of this sequence. Consequently, the acceleration sequence of the heat transfer gas (helium gas pressure increase) is executed by the gas supply section 51.

Specifically, the CPU transmits control signals to the valves V43, V44, V45, V46, V65, and V66, MFCs 73 and 80, and PCVs 76 and 83. Consequently, control is performed on the flow rate and pressure of helium gas supplied to the gap between the mount face and the bottom of the wafer W through the peripheral holes 47 and central holes 48.

In the system controller shown in FIG. 5, a plurality of end devices are not directly connected to the EC 89, but are connected to the I/O portions 100, which are arranged to form an I/O module. The I/O module is connected to the EC 89 through the corresponding MC and switching hub 93. Consequently, the communication system is simplified.

The control signals transmitted by the CPU of the EC 89 contain the addresses of the I/O portions 100 connected to predetermined end devices, and the address of the I/O module including the I/O portions 100. The switching hub 93 refers to the address of the I/O module contained in control signals. The MC GHOST refers to the addresses of the I/O portions 100 contained in control signals. Consequently, there is no need for the switching hub 93 or MC to inquire of the CPU the transmission destination of control signals, thereby realizing smooth transmission of control signals.

The MC 90 observes the gas supply section 51 through the GHOST network 95 and the I/O portions 100 of the I/O module 97, in the acceleration sequence of the heat transfer gas and so forth. The MC 90 transmits to the EC 89 through the switching hub 93 an interlock (I/L) signal to stop subsequent wafers W being transferred, if the following states are observed. (1) The pressure of helium gas in the peripheral supply circuit 68 or central supply circuit 69 (which will be referred to as supply circuit helium gas) does not satisfy predetermined stable conditions in a predetermined time. (2) The supply circuit helium gas deviates from predetermined stable conditions. (3) Leakage of helium gas occurs between the bottom of the wafer W and worktable, and a decrease thereby caused in the pressure of the supply circuit helium gas is detected. (4) The pressure of the supply circuit helium gas exceeds a predetermined value after the portion below the bottom of the wafer W is vacuum-exhausted.

When the EC 89 receives the interlock signal, it transmits a wafer transfer prohibitory signal to stop transfer of wafers W, to the MC 92 for controlling the operation of the loader transfer chamber 9, through the switching hub 93. When the MC 92 receives the wafer transfer prohibitory signal, it controls the operation of end devices associated with wafer transfer to stop wafers W being transferred.

Figure 6:
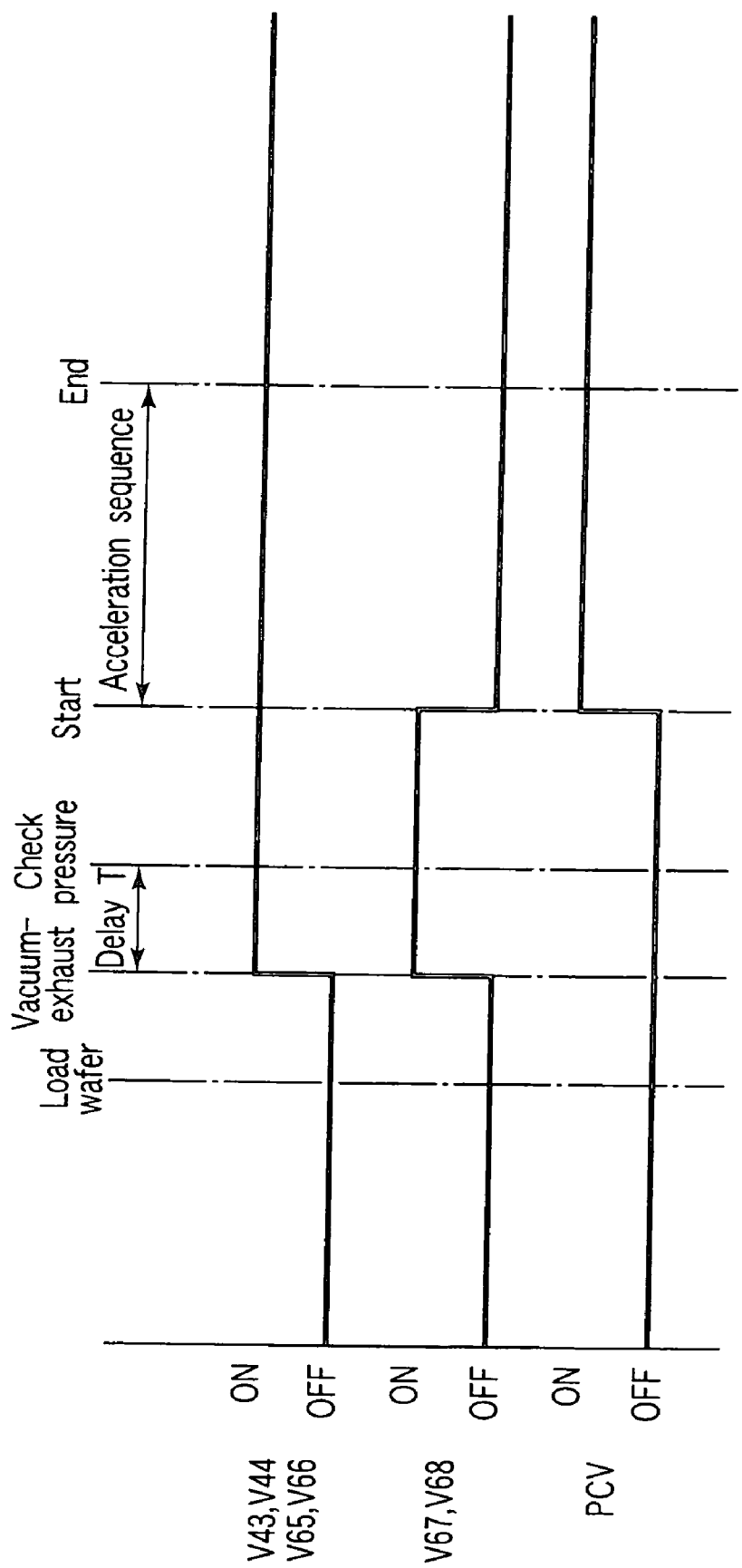
FIG. 6 is a timing chart showing an acceleration sequence of a heat transfer gas executed before an RIE process in the apparatus shown in FIG. 2.

FIG. 6 is a timing chart showing the acceleration sequence of the heat transfer gas executed before an RIE process in the apparatus 12 shown in FIG. 2. As shown in FIG. 6, a wafer W to be processed is loaded into the process chamber 34, and is placed on the mount face of the susceptor 35. Then, the wafer W is attracted and held by the ESC electrode plate 44. Then, the valves V43, V44, V65, and V66 are opened, and the valves V67 and V68 are also opened. Consequently, the peripheral supply circuit 68 and central supply circuit 69 communicate with the TMP 66 and DP 38, and the main lines 70 and 77 and the sub lines 71 and 78 are vacuum-exhausted by the TMP 66 and DP 38. At this time, the supply passages 49 and 50 are also simultaneously vacuum-exhausted.

Then, when a predetermined time (Delay T) has elapsed, the CMs 74 and 75 measure the pressure of helium gas flowing through the main lines 70 and 77, respectively, as described later. Consequently, the line pressures inside the peripheral supply circuit 68 and central supply circuit 69 are checked (pressure measurement values are obtained).

Then, in order to start the acceleration sequence, the valves V67 and V68 are closed, and the PCVs 76 and 83 are operated to control the pressure of helium gas flowing through the main lines 70 and 77. Further, although not shown, the MFCs 73 and 80 are operated to control the flow rate of helium gas flowing through the main lines 70 and 77. In this state, the acceleration sequence is executed, as described later.

After the acceleration sequence is completed, an RIE process is performed on the wafer W. At this time, while the valves V43, V44, V65, and V66 are opened, and the valves V67 and V68 are closed, the PCVs 76 and 83, and the MFCs 73 and 80 are kept operated. Consequently, while the RIE process is performed on the wafer W, the pressure of helium gas flowing through the main lines 70 and 77 is controlled, and the flow rate of helium gas flowing through the main lines 70 and 77 is also controlled.

Incidentally, accordingly to the conventional acceleration sequence described in "Description of the Related Art", the MFCs 73 and 80 control the flow rate of helium gas flowing through the main lines 70 and 77 (which will be referred to as an acceleration flow rate), on the premise that the pressure in the lines is zero. In other words, the acceleration sequence is arranged to raise the pressure in the main lines 70 and 77 from zero to a preset supply pressure of helium gas prescribed in the recipe of the RIE process (which will be referred to as a recipe-prescription pressure). Consequently, the acceleration flow rate of the conventional acceleration sequence exceeds the necessary flow rate for attaining the recipe-prescription pressure, thereby deteriorating the controllability of the gas supply section 51. Accordingly, the method for setting the acceleration flow rate needs to be reviewed.

In consideration of the problem, the substrate processing method according to this embodiment is arranged to set the acceleration flow rate based on the pressure difference between a measurement pressure in the main lines 70 and 77 and the recipe-prescription pressure, (which will be simply referred to as a pressure difference). The pressure difference is coordinated with the acceleration flow rate in advance in an acceleration sequence table. FIG. 12 is a view showing a table for the acceleration sequence of the heat transfer gas executed before the RIE process. The acceleration sequence table is stored in the HDD of the MC (such as the MC 90) corresponding to the gas supply section 51.

The acceleration sequence table shown in FIG. 12 is arranged to set an acceleration flow rate (preparatory flow rate) in accordance with a preset flow rate of helium gas prescribed in the recipe of an RIE process (which will be referred to as a recipe-prescription flow rate) and the pressure difference. The table is also arranged to set a time period for supplying helium gas to the main lines 70 and 77 at the acceleration flow rate (which will be referred to as an acceleration time (preparatory time)). Such an acceleration sequence table is prepared by an operation described below, which is performed in the plasma processing apparatus 12 before the RIE process is performed on the wafer W. Specifically, a plurality of acceleration sequences are actually executed using tentative combinations each formed of a recipe-prescription flow rate, a pressure difference, an acceleration flow rate, and an acceleration time. From the tentative combinations, an acceleration flow rate and an acceleration time associated therewith are selected to cause the pressure in the main lines 70 and 77 not to overshoot the corresponding recipe-prescription pressure, but to reach the recipe prescription pressure in a short time. The acceleration flow rate and acceleration time thus obtained are optimum conditions for the corresponding recipe-prescription flow rate and pressure difference. Accordingly, this coordinate is registered in the acceleration sequence table.

The pressure difference prescribed in the acceleration sequence table preferably ranges from almost zero to the absolute value of the corresponding recipe-prescription pressure. In this case, the acceleration sequence table can always include any pressure difference based on the measurement pressure in the main lines 70 and 77. Accordingly, as described later, it is possible to smoothly execute the acceleration sequence of the heat transfer gas (helium gas pressure increase) before the RIE process.

Further, in the case of the acceleration sequence table shown in FIG. 12, there are ranges of the recipe-prescription flow rate and pressure difference, in which the acceleration flow rate and acceleration time are respectively zero. This is so, because these flow rate ranges and pressure difference ranges are not used for the RIE process. Accordingly, for these ranges, the acceleration flow rate and acceleration time are respectively prescribed as being zero.

Such an acceleration sequence table is prepared for each type of plasma processing apparatuses. The MC is provided with tables for the acceleration sequence to correspond to a plurality of plasma processing apparatuses, and that one of the tables for the acceleration sequence to be used is changed every time the plasma processing apparatuses are switched.

Figure 7:
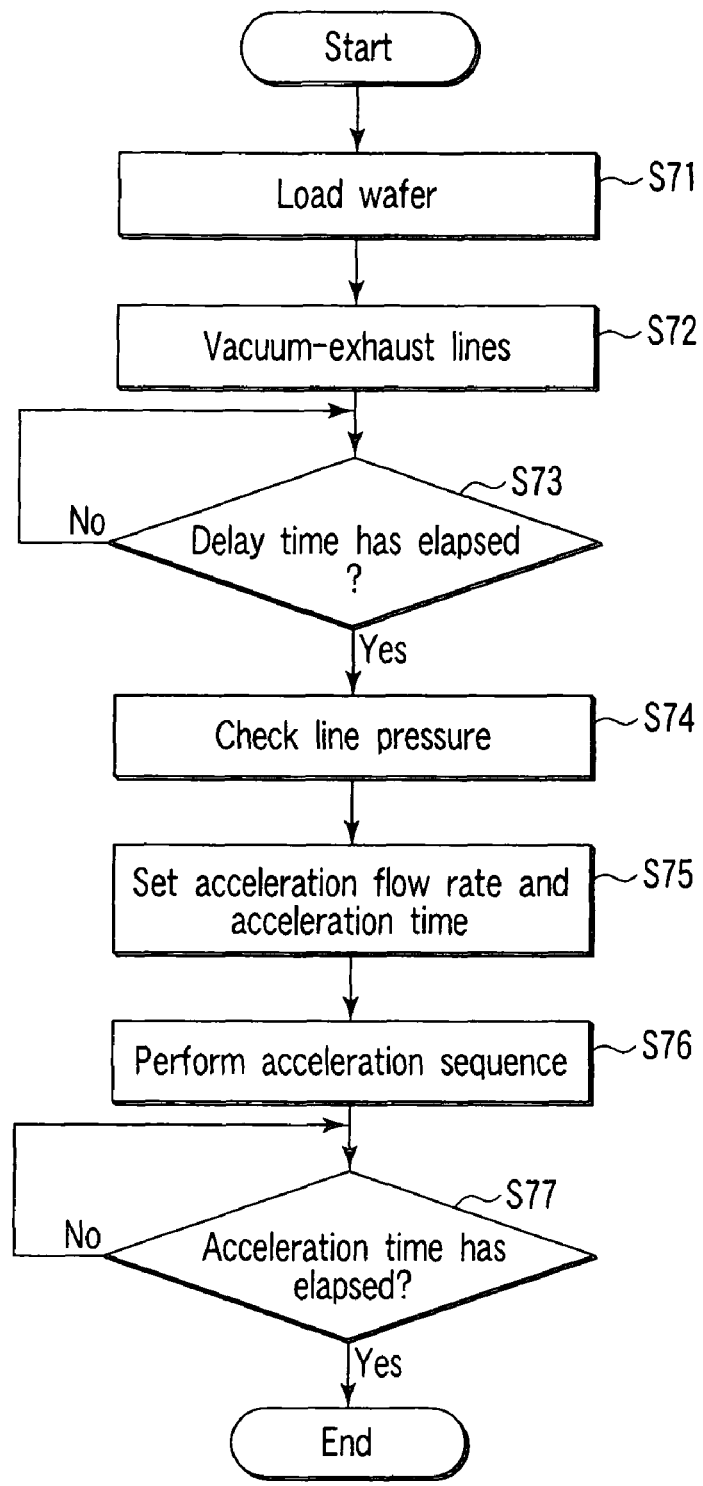
FIG. 7 is a flow chart showing the acceleration sequence of a heat transfer gas executed before an RIE process in the apparatus shown in FIG. 2.

FIG. 7 is a flow chart showing the acceleration sequence of the heat transfer gas executed before the RIE process in the apparatus 12 shown in FIG. 2.

The process is performed in the apparatus 12 by the CPU of the EC 89 or the like in accordance with a process program stored in the HDD of the EC 89 or the like. Users can select whether to execute the acceleration sequence based on the acceleration sequence table in the helium gas pressure increase prior to the RIE process. Specifically, in order to select execution of the acceleration sequence based on the acceleration sequence table, the corresponding option "CT1" needs to be selected from a process menu shown on the display of the operational controller 13, before the program is executed. Further, when the option "CT1" is selected, a menu is shown on the display, from which "Acceleration sequence by pressure difference" needs to be selected.

Furthermore, when the option "CT1" is selected, an option "Delay time designation" is shown on the display. If the option "Delay time designation" is selected, an input column is shown to input a delay time (Delay T). This delay time is a time period from a start of vacuum-exhaust of the supply passages 49 and 50 in a step S72 described below to a start of line pressure checking of the peripheral supply circuit 68 and central supply circuit 69 in a step S74 described below. If it is necessary to designate a delay time, a designated delay time needs to be input into this input column.

As shown in FIG. 7, a wafer W to be processed is loaded into the process chamber 34 and is placed on the mount face of the susceptor 35 (step S71). Then, a DC voltage is applied to the ESC electrode plate 44, so that the wafer W is attracted and held thereon. Further, a process gas is supplied from the showerhead 53 into the process chamber 34, while the APC valve 64 is opened, so that the interior of the process chamber 34 is maintained at a predetermined pressure.

When the pressure inside the process chamber 34 is stabilized at a predetermined value, the opening degree of the APC valve 64 is decreased by a predetermined amount. Then, the valves V43, V44, V65, V66, V67, and V68 are opened, so that the main lines 70 and 77, sub lines 71 and 78, and supply passages 49 and 50 are vacuum-exhausted by the TMP 66 and DP 38, while helium gas is being supplied (step S72).

Then, it is judged whether a designated delay time (Delay T) input by a user has elapsed from the start of vacuum-exhaust of the supply passages 49 and 50 and so forth (step S73). If the delay time has not yet elapsed, the flow returns to the step S73. If the delay time has elapsed, the flow proceeds to a step S74. Where there is no designated delay time input by a user, a default value of delay time stored in the HDD of the MC or the like is used.

Then, in the step S74, the pressures of helium gas flowing through the respective main lines 70 and 77 are measured by the CMs 74 and 75 to check the line pressures of the peripheral supply circuit 68 and central supply circuit 69 (a step of measuring the line pressure).

Then, a pressure difference between the measurement pressure in the main lines 70 and 77 and the recipe-prescription pressure is calculated. Then, in accordance with the calculated pressure difference and recipe-prescription flow rate, an acceleration flow rate and an acceleration time are selected from the acceleration sequence table. Then, they are set to be the acceleration flow rate (preparatory flow rate) and acceleration time (preparatory time) of this acceleration sequence (step S75; a step of setting the flow rate of the heat transfer gas).

Then, the valves V67 and V68 are closed, and the MFCs 73 and 80 are operated to control the flow rate of helium gas flowing through the main lines 70 and 77 to be the set acceleration flow rate, so as to execute the acceleration sequence (step S76), (a step of controlling the flow rate of the heat transfer gas). At this time, the PCVs 76 and 83 are also operated to control the pressure of helium gas flowing through the main lines 70 and 77.

Further, during the acceleration sequence, the line pressures of peripheral supply circuit 68 and central supply circuit 69 are checked by the CMs 74 and 75. The line pressures thus checked are indicated in an apparatus state monitoring page shown on the display of the operational controller 13. FIG. 8 is a view showing the monitoring page on the display of an operational controller used in the system 1 shown in FIG. 1. As shown in FIG. 8, line pressures are indicated in spaces "State value" of columns "P/C" for showing state values of the pressure of plasma processing apparatuses. Further, spaces "Set value" of columns "P/C" are used for showing recipe-prescription pressures. Consequently, users can estimate the remaining time necessary for the line pressures of the peripheral supply circuit 68 and central supply circuit 69 to reach the recipe-prescription pressure.

Then, it is judged whether the set acceleration time has elapsed (step S77). If the acceleration time has not yet elapsed, the flow returns to the step S76. If the acceleration time has elapsed, the acceleration sequence is completed.

After the acceleration sequence (helium gas pressure increase) is completed, the RIE process is performed on the wafer W. At this time, while the valves V43, V44, V65, and V66 are opened and the valves V67 and V68 are closed, the PCVs 76 and 83, and the MFCs 73 and 80 are kept operated. Consequently, the flow rate of helium gas flowing through the main lines 70 and 77 is controlled to be the recipe-prescription flow rate, and the pressure of helium gas flowing through the main lines 70 and 77 is controlled to be the recipe-prescription pressure.

In the RIE process, an RF power is applied from the RF power supply 41 to the susceptor 35, and an RF power is applied from the RF power supply 55 to the showerhead 53. When a predetermined time has elapsed from the start of the RIE process, application of the RF powers from the RF power supply 41 and RF power supply 55 is stopped, and supply of helium gas from the gas supply section 51 to the gap between the mount face and the bottom of the wafer W is also stopped. Then, electricity is removed from the ESC electrode plate 44, and the supply of the process gas from the showerhead 53 into the process chamber 34 is stopped, whereby this process is completed.

In the method of using the apparatus according to the embodiment described above, the pressure of helium gas flowing through the main lines 70 and 77 is measured prior to the RIE process. Then, in accordance with the pressure difference between the measurement pressure in the main lines 70 and 77 and the recipe-prescription pressure, an acceleration flow rate and an acceleration time are selected from the acceleration sequence table described above. Then, they are set to be the acceleration flow rate and acceleration time of this acceleration sequence, and helium gas is supplied into the main lines 70 and 77 at the set acceleration flow rate. Accordingly, this set acceleration flow rate can be a flow rate optimized to attain the recipe-prescription pressure, so that the controllability of the gas supply section 51 is prevented from being deteriorated. In addition, the recipe-prescription pressure can be attained in a shorter time, so that the throughput is improved.

The pressure difference is coordinated with the acceleration flow rate and acceleration time in the acceleration sequence table. From the acceleration sequence table, an acceleration flow rate and an acceleration time are selected and used as set values. Consequently, the acceleration flow rate and acceleration time can be swiftly set, so that the throughput is further improved.

Further, supply of helium gas at the acceleration flow rate into the main lines 70 and 77 is performed only for the acceleration time. In this case, the supply of helium gas at the acceleration flow rate can be stopped at the exact time the recipe-prescription pressure is attained. Accordingly, the controllability of the gas supply section 51 is reliably prevented from being deteriorated.

Furthermore, when a delay time has elapsed from the start of vacuum-exhaust of the supply passages 49 and 50 and so forth, the pressure of helium gas flowing through the main lines 70 and 77 is measured. In this case, the pressure is measured in a state where the flow of helium gas is stable, so that the controllability of the gas supply section 51 can be more accurate. Users are allowed to input the delay time, so that they can change the delay time for the semiconductor processing system 1 based on their experience, which helps to realize an optimum throughput.

While the acceleration sequence of the heat transfer gas is being executed, if a problem arises in the gas supply section 51, the sequence is halted (interlocked), and the subsequent RIE process is also not executed. An example of such a problem is a case where the pressure of helium gas flowing through the main lines 70 and 77 becomes unstable after the delay time. Another example of such a problem is a case where the pressure of helium gas flowing through the main lines 70 and 77 becomes unstable while the flow rate of helium gas is being controlled by the MFCs 73 and 80.

Figure 9:
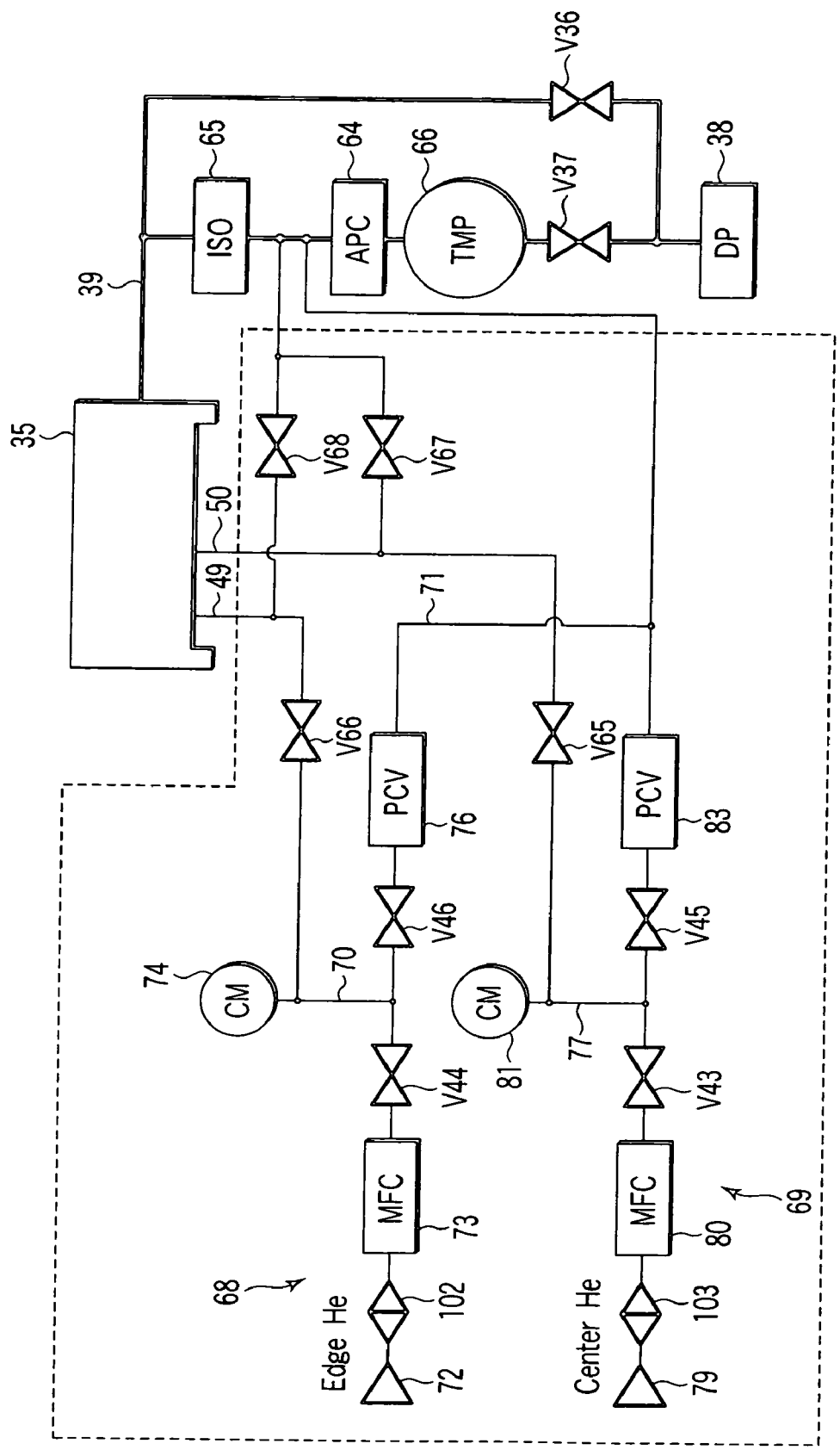
FIG. 9 is a piping diagram schematically showing the structure of a heat transfer gas supply mechanism according to a modification.

The structure of the heat transfer gas supply mechanism of the plasma processing apparatus 12 is not limited to that of the gas supply section 51 described above, and any arrangement can be used for the same as long as it is configured to respectively supply helium gas into the supply passages 49 and 50. FIG. 9 is a piping diagram schematically showing the structure of a heat transfer gas supply mechanism according to a modification. The modification shown in FIG. 9 includes no ACCs. FIG. 9 shows a main exhaust line and a bypass line different from the main exhaust line and bypass line of the plasma processing apparatus 12. The main exhaust line shown in FIG. 9 is provided with an APC valve 64 disposed between an isolator 65 and a TMP 66. The bypass line shown in FIG. 9 is disposed to bypass the isolator 65, APC valve 64, and TMP 66.

In the embodiment described above, the acceleration sequence table and acceleration sequence program (helium gas pressure increase) used prior to the RIE process are stored in the HDD of an MC corresponding to the gas supply section 51. Alternatively, such data may be stored in the HDD or the like of the EC 89.

In the embodiment described above, the plasma processing apparatus is exemplified by an etching apparatus. The present invention, however, is applicable to another plasma processing apparatus, without being limited to the embodiment. For example, the present invention may be implemented in a CVD (Chemical Vapor Deposition) or PVD (Physical Vapor Deposition) apparatus, where it is arranged as a plasma processing apparatus including a heat transfer gas supply mechanism.

Figure 10:
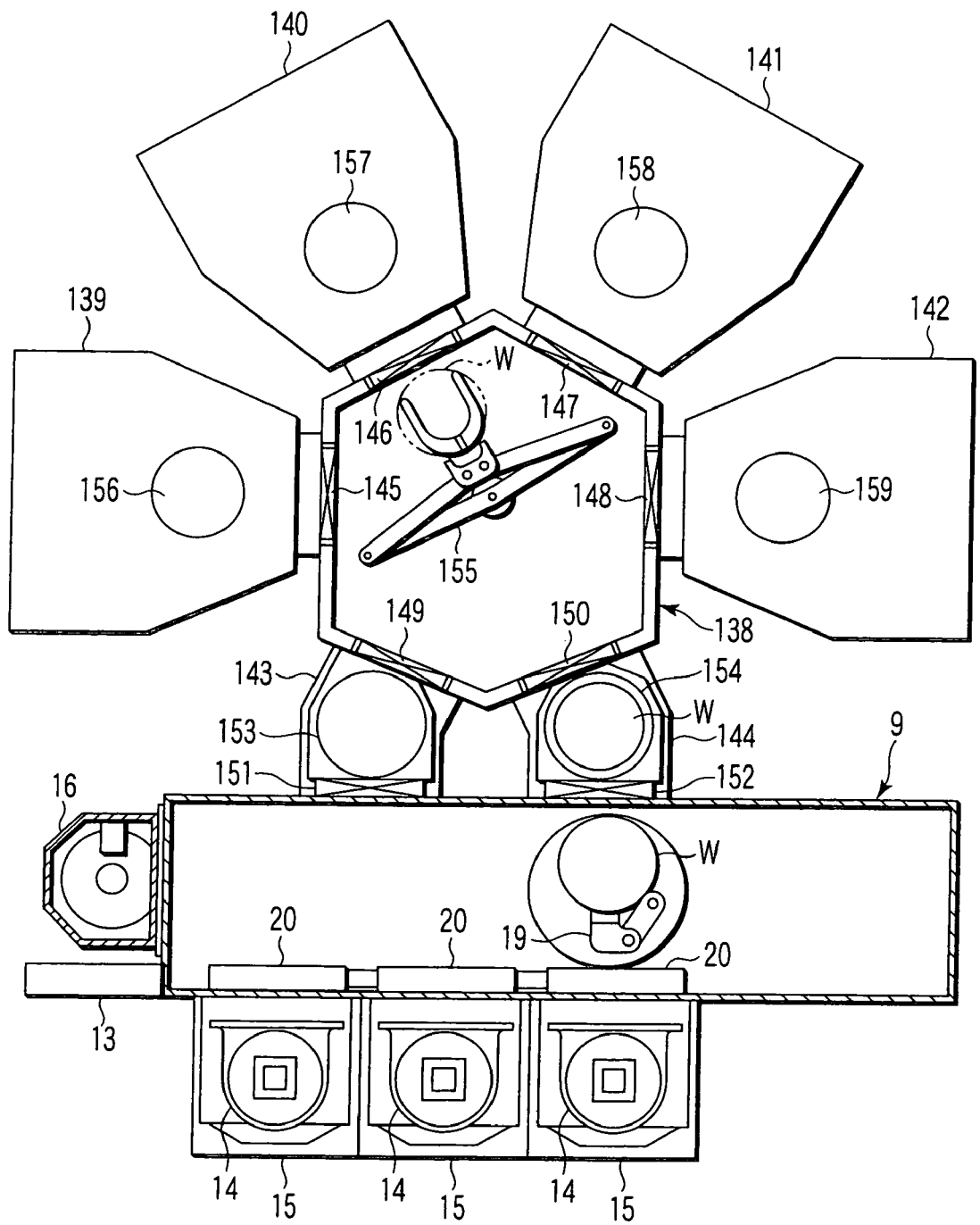
FIG. 10 is a plan view schematically showing the structure of a semiconductor processing system according to an alternative embodiment of the present invention.
Figure 11:
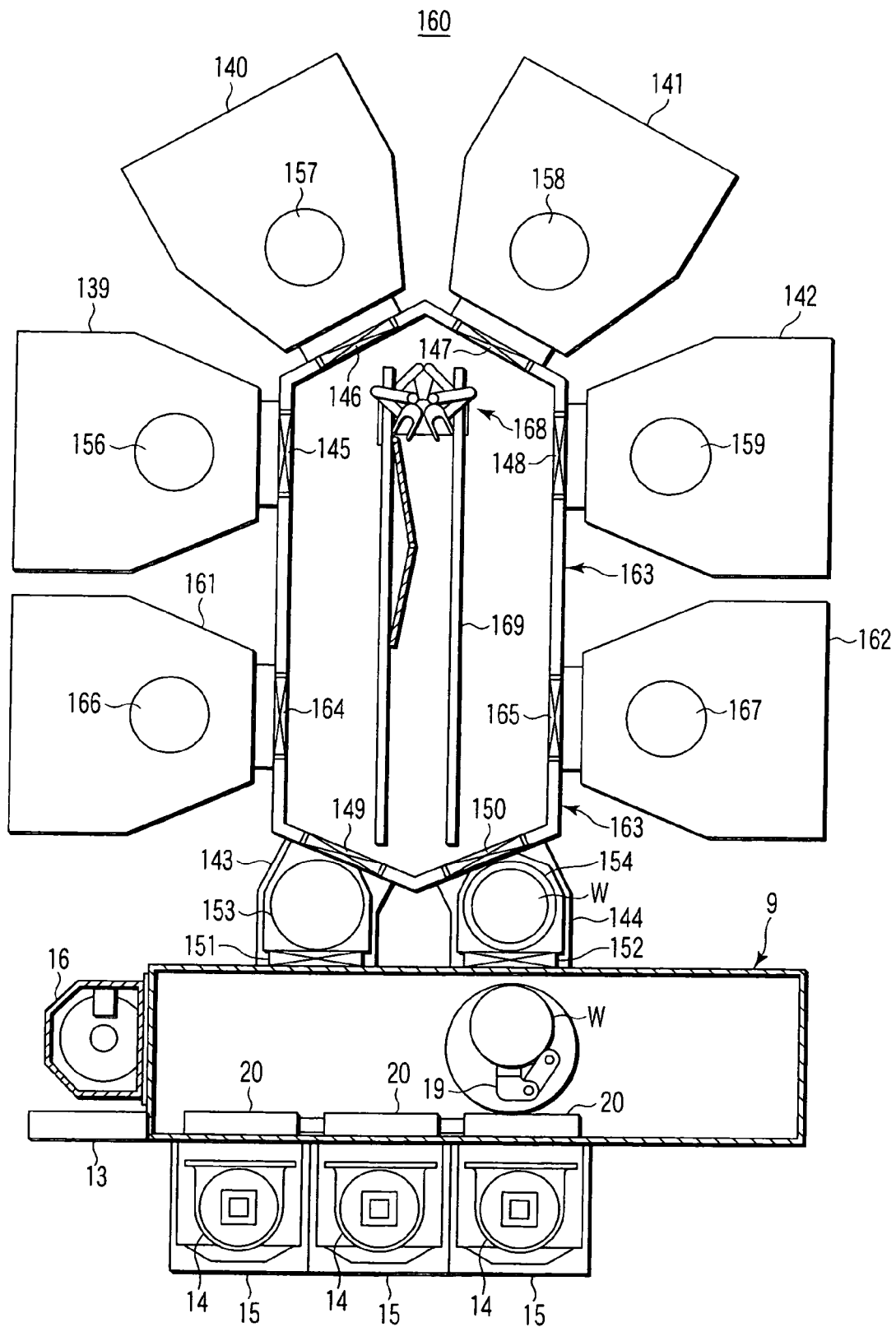
FIG. 11 is a plan view schematically showing the structure of a semiconductor processing system according to a further alternative embodiment of the present invention.

The semiconductor processing system shown in FIG. 1 is of the parallel type that includes a plurality of process ships disposed in parallel. The present invention, however, is applicable to another semiconductor processing system, without being limited to the embodiment. FIG. 10 is a plan view schematically showing the structure of a semiconductor processing system according to an alternative embodiment of the present invention. FIG. 11 is a plan view schematically showing the structure of a semiconductor processing system according to a further alternative embodiment of the present invention. In these systems, a plurality of plasma processing apparatuses are disposed in a radial pattern around a transfer chamber.

The semiconductor processing system 137 shown in FIG. 10 includes a common transfer chamber 138 having a hexagonal shape in the plan view, and four plasma processing apparatuses 139 to 142 disposed in a radial pattern around the common transfer chamber 138. The common transfer chamber 13 is connected to a loader transfer chamber through two load-lock chambers 143 and 144. The pressures inside the common transfer chamber 138 and plasma processing apparatuses 139 to 142 are maintained at a vacuum. The common transfer chamber 138 is connected to the plasma processing apparatuses 139 to 142 through vacuum gate valves 145 to 148, respectively.

In the semiconductor processing system 137, the pressure inside the loader transfer chamber 9 is maintained at atmospheric pressure, while the pressure inside the common transfer chamber 138 is maintained at a vacuum. Accordingly, each of the load-lock chambers 143 and 144 is arranged as a vacuum preparation transfer chamber that can adjust the inner pressure. The load-lock chambers 143 and 144 are connected to the common transfer chamber 138 through vacuum gate valves 149 and 150, respectively. Further, the load-lock chambers 143 and 144 are connected to the loader transfer chamber 9 through atmospheric door valves 151 and 152, respectively. The load-lock chambers 143 and 144 respectively include wafer tables 153 and 154 for temporarily placing a wafer W to be transferred between the loader transfer chamber 9 and common transfer chamber 138.

The common transfer chamber 138 is provided with a transfer arm 155 of the frog-leg type disposed therein, which is extendable/retractable and swingable. The transfer arm 155 is arranged to transfer a wafer W among the plasma processing apparatuses 139 to 142 and load-lock chambers 143 and 144.

The plasma processing apparatuses 139 to 142 respectively include susceptors 156 to 159 each for placing thereon a wafer W to be subjected to an RIE process. Each of the plasma processing apparatuses 139 to 142 has the same structure as that of the plasma processing apparatus 12 of the semiconductor processing system 1.

Each of the components of the semiconductor processing system 137 is operated under the control of a system controller having the same structure as the system controller of the semiconductor processing system 1.

The semiconductor processing system 160 shown in FIG. 11 has a structure formed by adding two plasma processing apparatuses 161 and 162 to the semiconductor processing system 137 shown in FIG. 10. Accordingly, the system includes a common transfer chamber 163 having a different shape from the common transfer chamber 138 of the semiconductor processing system 137. The additional two plasma processing apparatuses 161 and 162 are connected to the common transfer chamber 163 through vacuum gate valves 164 and 165, respectively. The plasma processing apparatuses 161 and 162 respectively includes susceptors 166 and 167 each for placing a wafer W thereon.

The common transfer chamber 163 is provided with a transfer arm unit 168 having two transfer arms of the scalar arm type. The transfer arm unit 168 is movable along guide rails 169 extending in the common transfer chamber 163 to transfer wafers W among the plasma processing apparatuses 139 to 142, 161, and 162, and load-lock chambers 143 and 144.

Each of the components of the semiconductor processing system 160 is operated under the control of a system controller having the same structure as the system controller of the semiconductor processing system 1.

In the embodiment described above, the substrate to be processed is exemplified by a semiconductor wafer, but the substrate is not limited thereto. For example, the substrate to be processed may be a glass substrate for, e.g., an LCD (Liquid Crystal Display) or FPD (Flat Panel Display). In the embodiment described above, the heat transfer gas is exemplified by helium gas, but the heat transfer gas may be another rare gas, without being limited to helium gas.

The present invention is further directed to a storage medium that stores the program codes of software for realizing the function described above according to the embodiment. Such a storage medium is supplied to a computer, such as the EC 89, and the CPU of the computer reads out the program codes stored in the storage medium to execute the method described above. In this case, the program codes read out of the storage medium realizes the function described above according to the embodiment. Accordingly, the program codes and storage medium that stores the program codes are within the scope of the present invention.

Examples of the storage medium for supplying the program codes are a RAM, NVRAM, floppy (TM) disk, hard disk, optical disk, magneto-optical disk, CD-ROM, CD-R, CD-RW, DVD (DVD-ROM, DVD-RAM, DVD-RW, DVD+RW), magnetic tape, non-volatile memory card, and another ROM, that can store the program codes. Alternatively, the program codes may be supplied to a computer by download from another computer or database connected to the Internet, business network, or local area network.

Further, the present invention is not limited to a case where a CPU reads out and executes the program to realize the function described above according to the embodiment. For example, the present invention encompasses a case where an OS (operating system) running on an CPU executes a part or the entire of an actual process in accordance with the instruction of the program codes, while the process realizes the function described above according to the embodiment.

Furthermore, the present invention encompasses a case a process described below realizes the function described above according to the embodiment. Specifically, the program codes read out from a storage medium are written in a memory provided in a function extension board inserted in a computer or a function extension unit connected to a computer. Then, the CPU or the like of the function extension board or function extension unit executes a part or the entire of an actual process in accordance with the instruction of the program codes.

The program codes may be formed of object codes, program codes executed by an interpreter, or script data supplied to an OS.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of using a substrate processing apparatus, for performing a main process on a substrate in a vacuum,
the apparatus including
a process chamber configured to accommodate the substrate,
a worktable disposed in the process chamber to place the substrate thereon,
a temperature adjusting mechanism configured to adjust a temperature of the worktable,
a heat transfer gas supply mechanism equipped with a supply valve configured to supply a heat transfer gas from the supply valve through a supply passage equipped with a mass flow controller into a portion between the worktable and the substrate to improve thermal conductivity between the worktable and the substrate,
a vacuum exhaust section connected to the process chamber through an exhaust line equipped with an exhaust valve, for vacuum-exhausting the process chamber,
a connection line connecting the supply passage to the exhaust line and configured to be selectively opened and closed by a connection valve, and
a control section configured to control an operation of the apparatus,
the method is preset to be performed under control of the control section and comprising, while the substrate is kept placed on the worktable:
continuing exhaust of the supply passage and simultaneous supply of the heat transfer gas into the supply passage by the vacuum exhaust section, with the connection valve of the connection line set open, mass flow controller set open and the supply valve set open, for a predetermined time period of from a first time point to a second time point thereafter;
then, in a period of from the second time point to a third time point thereafter, measuring a pressure inside the supply passage to obtain a pressure measurement value, and determining a preparatory flow rate of the heat transfer gas to be supplied through the supply passage into the portion between the worktable and the substrate and a preparatory time defining a period for supplying the heat transfer gas at the preparatory flow rate, in accordance with a pressure difference between the pressure measurement value and a pressure reference value, the preparatory flow rate and the preparatory time being conditions of an acceleration sequence, which supplies the heat transfer gas into the supply passage at a flow rate larger than a recipe flow rate used for the main process before the main process is performed inside the process chamber;
then, performing the acceleration sequence by continuing supply of the heat transfer gas into the supply passage at the preparatory flow rate by giving a preparatory set point to the mass flow controller and controlling the pressure inside the supply passage by a pressure control valve, with the connection valve of the connection line set closed and the supply valve set open, for a period defined by the preparatory time from the third time point to a fourth time point thereafter;
without performing the main process inside the process chamber during the periods of from the first time point to the fourth time point; and
then, starting, after the fourth time point, the main process on the substrate inside the process chamber set in a vacuum state by the vacuum exhaust section, while supplying the heat transfer gas into the supply passage at a recipe flow rate by giving a recipe flow rate set point to the mass flow controller and controlling the pressure inside the supply passage at a recipe pressure set point by the pressure control valve, with the connection valve of the connection line set closed and the supply valve set open.

2. The method according to claim 1, wherein the method further comprises supplying the heat transfer gas through the supply passage into the portion between the worktable and the substrate at a flow rate lower than the preparatory flow rate, after the preparatory time has elapsed.

3. The method according to claim 1, wherein the recipe flow rate is lower than the preparatory flow rate and the pressure reference value is preset in accordance with the recipe flow rate.

4. The method according to claim 1, wherein the method further comprises, in order to determine the preparatory flow rate and the preparatory time, referring to a table that prescribes a plurality of values of the preparatory flow rate and the preparatory time coordinated with a plurality of values of the pressure difference.

5. The method according to claim 4, wherein the table prescribes a plurality of values of the preparatory time coordinated with a plurality of values of the preparatory flow rate.

6. The method according to claim 1, wherein the method further comprises setting the predetermined time period in accordance with a value input into the apparatus by an operator in advance.

7. The method according to claim 1, wherein the method comprises continuing exhaust of the supply passage by the vacuum exhaust section and supply of the heat transfer gas into the supply passage, with the connection valve of the connection line set open and the supply valve set open, for the period of from the second time point to the third time point.

8. The method according to claim 1, wherein the method comprises keeping the exhaust valve of the exhaust line set such that the vacuum exhaust section communicates with the process chamber during the period of from the first time point to the fourth time point.

* * * * *